United States Patent

Dubbelday et al.

[11] Patent Number: 5,951,757
[45] Date of Patent: Sep. 14, 1999

[54] METHOD FOR MAKING SILICON GERMANIUM ALLOY AND ELECTRIC DEVICE STRUCTURES

[75] Inventors: Wadad B. Dubbelday, Spring Valley; Paul R. de la Houssaye, San Diego; Shannon D. Kasa, San Diego; Isaac Lagnado, San Diego, all of Calif.

[73] Assignee: The United States of America as represented by the Secretary of the Navy, Washington, D.C.

[21] Appl. No.: 08/851,768

[22] Filed: May 6, 1997

[51] Int. Cl.$^6$ .................................................. C30B 25/02
[52] U.S. Cl. .......................... 117/102; 117/88; 117/105
[58] Field of Search ................................ 117/88, 94, 96, 117/101, 102, 105, 902; 438/967

[56] References Cited

U.S. PATENT DOCUMENTS 5,205,871  4/1993  Godbey et al. ......................... 148/33.3

OTHER PUBLICATIONS

"Epitaxial Growth of SiGe on $Al_2O_3$ using $Si_2H_6$ gas and Ge Solid Source Molecular Beam Epitaxy"; Wado et al., Journal of Crystal Growth 169 (1996) pp. 457–462, Apr. 1996.

*Primary Examiner*—Felisa Hiteshew
*Attorney, Agent, or Firm*—Harvey Fendelman; Michael A. Kagan; Eric James Whitesell

[57] ABSTRACT

A method for fabricating silicon-germanium alloy on a sapphire substrate of the present invention comprises the steps of passivating a surface of a sapphire substrate, maintaining a deposition temperature of about 900 degrees C., exposing the passivated surface to a flow of about 1 slm of about 2 percent silane in a hydrogen carrier and a flow of at least 200 sccm of about 10 percent germane in a hydrogen carrier to form a layer of single crystal silicon germanium alloy on the passivated surface of the sapphire substrate, and ramping the temperature down to about 650 degrees C. during the step of exposing the passivated surface to the germane gas.

10 Claims, 3 Drawing Sheets

METHOD FOR MAKING SILICON GERMANIUM ALLOY AND ELECTRIC DEVICE STRUCTURES

LICENSING INFORMATION

The invention described below is assigned to the United States Government and is available for licensing commercially. Technical and licensing inquiries may be directed to Harvey Fendelman, Legal Counsel For Patents, NCCOSC RDTE DIV CODE 0012, 53510 Silvergate Avenue Room 103, San Diego, Calif. 92152-5765; telephone no. (619)553-3818; fax no. (619)553-3821.

CROSS-REFERENCE TO RELATED APPLICATIONS

This application is related to co-pending patent application titled SILICON GERMANIUM HETEROSTRUCTURES ON SILICON-ON-SAPPHIRE by Wadad Dubbelday et al. filed May 6, 1997.

BACKGROUND OF THE INVENTION

The present invention relates to a method of forming single crystal silicon-germanium alloy on a sapphire substrate. More specifically, but without limitation thereto, the present invention relates to the fabrication of single crystal silicon germanium alloy on a sapphire substrate for making integrated circuitry and electronic devices having improved performance characteristics.

The operating characteristics of CMOS and bipolar silicon devices may be enhanced by the implementation of silicon-germanium alloy structures. By careful control of the bandgap and engineered strain into the alloy heterostructure, significant performance enhancements may be realized. Strain is introduced into the structure when the heterogeneous alloy initially assumes the lattice structure spacing of the underlying surface material. As the thickness of the alloy film is increased, the alloy lattice structure relaxes, creating a network of misfit dislocations that may adversely affect the performance characteristics.

Devices that rely on hole conductance and confinement benefit from strained silicon-germanium alloys deposited on a relaxed silicon film, but n-channel devices are typically optimized using tensile strained silicon deposited on relaxed silicon-germanium alloys. Bulk silicon is of course readily available, but not silicon-germanium alloy substrates. Also, it would be highly desirable to have both relaxed silicon and silicon-germanium alloy on the same substrate to realize optimum performance from both n-type and p-type devices.

To obtain relaxed substrates of silicon and silicon-germanium alloy on a bulk silicon substrate requires elaborate and complicated film deposition sequences, including the deposition of thick graded buffer layers to achieve relaxed, defect-free silicon-germanium alloy on the bulk silicon substrate. The resulting topographic variation in circuit structure does not allow for thin film devices with their advantageous reduction in short channel effects, further contributing to the complexity of this process.

Silicon having a lattice orientation of [100] may be epitaxially deposited on the r-planes of sapphire designated as $\{1\bar{1}02\}$ free of strain induced from the lattice mismatch, although approximately 0.3 to 0.4% compressive strain is introduced as a result of the high deposition temperature and the mismatch between the thermal coefficients of expansion of silicon and sapphire, respectively. The deposited films have a large number of stacking faults and twinning defects that may be eliminated by a sequence of silicon ion implantation and annealing steps. Some threading dislocations may remain in the resulting film, although this should not significantly affect performance. In addition, careful high resolution TEM studies indicate that the resulting interface is incoherent. Although evidence of misfit dislocations has been observed, the misfits are at the silicon-sapphire interface and well away from the conducting channel.

Pure germanium films have been grown on sapphire on different lattice orientations of sapphire $\{1\bar{1}02\}$ and germanium [111]. Pure germanium grows as [110] on sapphire $\{1\bar{1}02\}$. Silicon-germanium [100] alloy films may also be grown epitaxially directly on a sapphire surface, though currently this process is more difficult than for pure silicon deposition. The silicon-germanium alloy film is believed to have similar properties to the pure silicon film, with the same lack of lattice induced strain and misfit dislocations. After the film reaches a critical thickness, the lattice structure assumes the spacing of the bulk crystal, and a relaxation of the interface with the sapphire crystal occurs so that approximately 10 percent lattice mismatch may be accommodated. However, during cooling from the deposition temperature and the accompanying reduction of silicon-germanium alloy atom mobility at the interface, the difference in thermal coefficients of expansion between the materials causes some strain in the film. The strain in the film is sufficient to increase the hole mobility and decrease the electron mobility beyond that observed in the bulk crystal.

In sufficiently thin silicon films grown directly on the surface of bulk or thick layer silicon-germanium alloy typically comprising 30 percent or more germanium, lattice mismatch occurs at the surface interface, forcing the silicon film to be in tensile stress. This differs from silicon and silicon-germanium alloy grown on sapphire in that there is no slip plane observed to relieve the stress at the interface. The tensile stress causes increased electron mobility and decreased hole mobility in the silicon film. In n-channel FET devices, the electron mobility is more important.

Epitaxial silicon germanium grown on a sapphire substrate at reduced temperatures of about 650 degrees C. was reported by Hiroyuki Wado et al in the article titled "Epitaxial growth of SiGe on $Al_2O_3$ using $Si_2H_6$ gas and Ge solid source molecular beam epitaxy" published in the *Journal of Crystal Growth* 169 (1996) pp. 457–462. A disadvantage of this method is that molecular beam epitaxy is not readily applicable to production processes.

A continuing need therefore exits for a method of fabricating a high quality silicon-germanium alloy on a sapphire substrate for optimizing both n-FET and p-FET devices fabricated on a common insulating substrate.

SUMMARY OF THE INVENTION

A method for fabricating a high quality silicon-germanium alloy on a sapphire substrate of the present invention is directed to overcoming the problems described above, and may provide further related advantages. No embodiment of the present invention described herein shall preclude other embodiments or advantages that may exist or become obvious to those skilled in the art.

A method for fabricating silicon-germanium alloy on a sapphire substrate of the present invention comprises the steps of passivating a surface of a sapphire substrate, maintaining a deposition temperature of about 900 degrees C., exposing the passivated surface to a flow of about 1 slm of about 2 percent silane in a hydrogen carrier and to a flow of at least 200 sccm of about 10 percent germane in a hydrogen carrier to form a layer of single crystal silicon germanium alloy on the passivated surface of the sapphire substrate, and ramping the temperature down to about 650 degrees C. during the step of exposing the passivated surface to the germane gas.

An advantage of the method for depositing silicon germanium alloy on a sapphire substrate of the present invention is that both bipolar and CMOS devices having superior performance characteristics to those formed in polycrystalline SiGe alloy may be produced for high-frequency applications.

Another advantage is that very large scale integrated circuits (VLSI) having both n-type and p-type devices such as bipolar transistors, sensors, photovoltaic cells, etc. may be fabricated on a single sapphire substrate.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

The highest quality silicon-on-sapphire is typically grown at medium temperatures of about 1000 degrees C. and high silane concentrations of about 2 percent at flow rates of about 5 slm at atmospheric pressure. This is contrary to the best conditions for SiGe growth, especially for obtaining a desirably high Ge content. The best conditions for SiGe growth require lower temperatures of about 900 degrees C., lower flow rates of about 2 percent silane in a hydrogen carrier of about 1 slm, and maximizing the flow rate of about 10 percent germane in a hydrogen carrier to at least 200 sccm, which is the highest flow rate available on a typical CVD system such as an ASM Epsilon 1 model E2.

Figure 1:
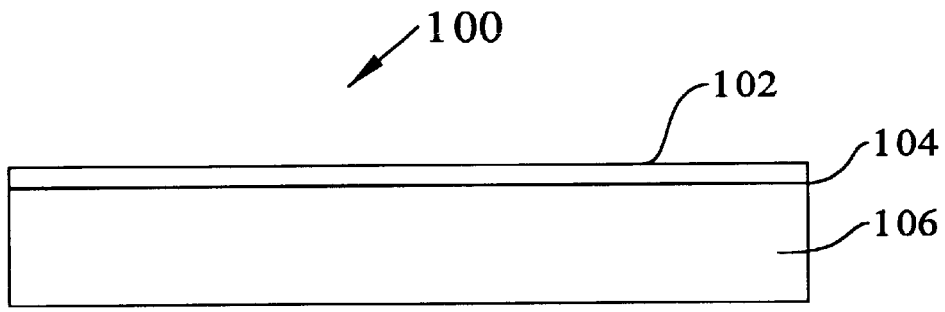
FIG. 1 is a diagram of a sapphire substrate passivated by depositing a layer of single crystal silicon.
Figure 2:
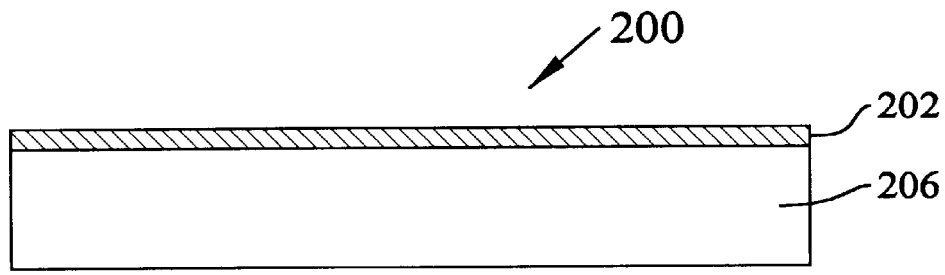
FIG. 2 is a diagram of a sapphire substrate passivated by thinning a layer of epitaxially regrown silicon.
Figure 3:
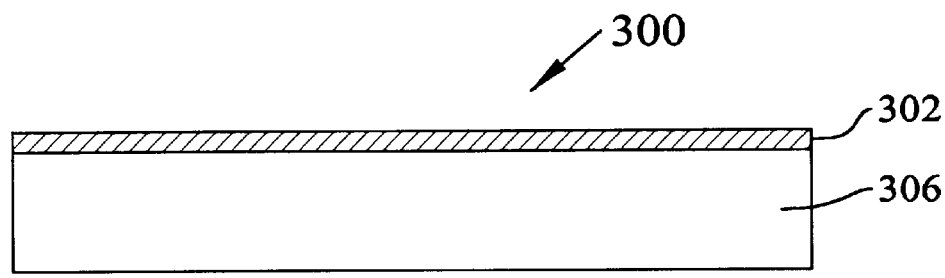
FIG. 3 is a diagram of a sapphire substrate passivated by exposing the surface of the sapphire substrate to hydrogen or deuterium gas.
Figure 4:
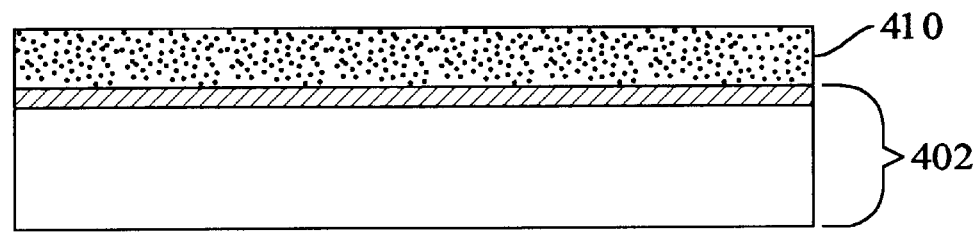
FIG. 4 is a diagram of a layer of single crystal SiGe deposited on a passivated sapphire substrate.
Figure 5:
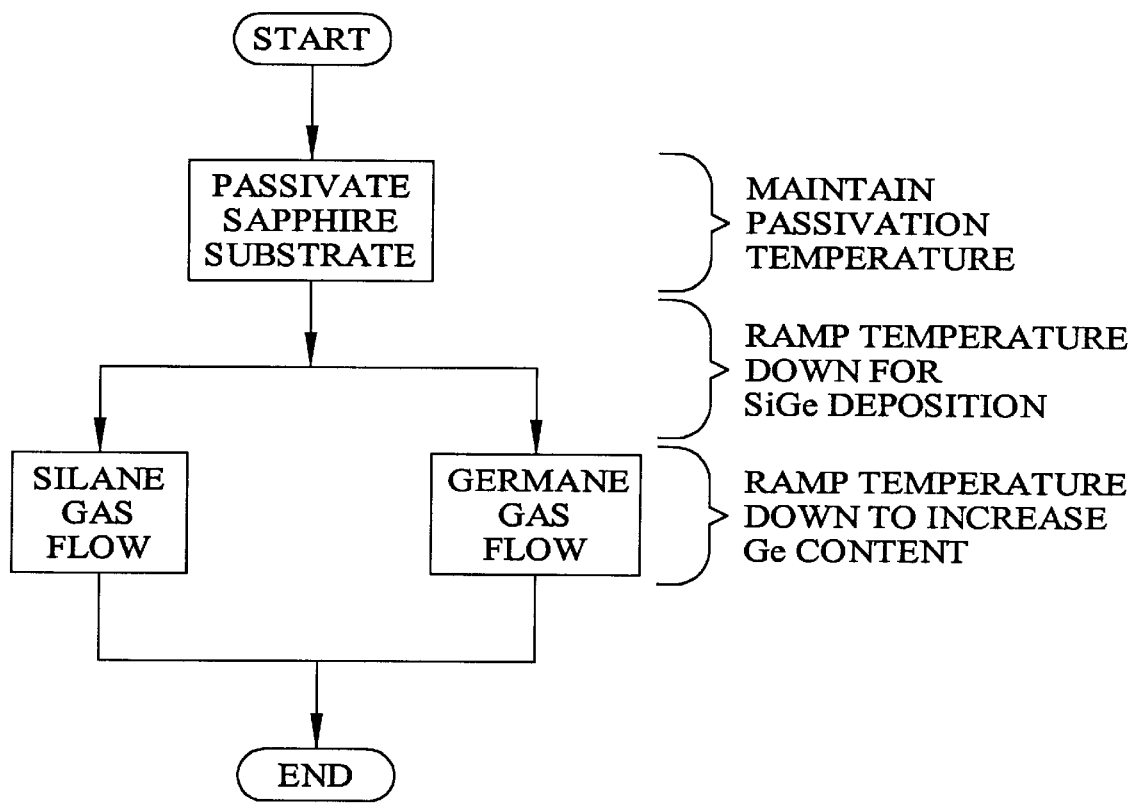
FIG. 5 is a flow chart of the method of the present invention for fabricating a layer of single crystal SiGe on a sapphire substrate.

Because a sapphire substrate reacts with germane to form a volatile byproduct GeO, it is desirable to passivate the sapphire substrate before introducing a significant amount of germane gas. A method for making a passivated sapphire substrate 100 diagrammed in FIG. 1 is to deposit a layer of single crystal silicon 102 by deposition or sputtering onto surface 104 of sapphire substrate 106, or by thinning SOS wafer 200 in FIG. 2 having an epitaxially regrown silicon layer 202 on sapphire substrate 206. A preferred thickness for silicon layers 102 and 202 is about 0.5 nm to 10 nm. Another method for making a passivated sapphire substrate 300 is to passivate sapphire substrate surface 302 by exposure to hydrogen or deuterium gas (deuterium adheres to sapphire better than hydrogen) at a high temperature of about 1100 to 1400 degrees C. and by ramping the temperature down to about 900 degrees C. to begin the single crystal side growth. The temperature may be ramped down again during deposition of SiGe film 410 in FIG. 4 on passivated sapphire substrate 402 to gradually increase the amount of germanium incorporated into film 410. A flow chart of the process described above for fabricating single crystal SiGe film 410 on passivated sapphire substrate 402 is shown in FIG. 5.

Alternatively, high temperatures of about 800 to 950 degrees C. may be used to deposit a mixture of silane and germane initially on the sapphire surface. Also, the sapphire surface may be modified before depositing the silicon germanium alloy by using ion implantation, chemical etch, or exposure to plasma to improve the performance characteristics of electronic devices such as n-FETS and p-FETS formed in the silicon germanium alloy. The germane flow may be ramped up during deposition to about 200 sccm of 10 percent germane in hydrogen to increase the germanium content.

Figure 6:
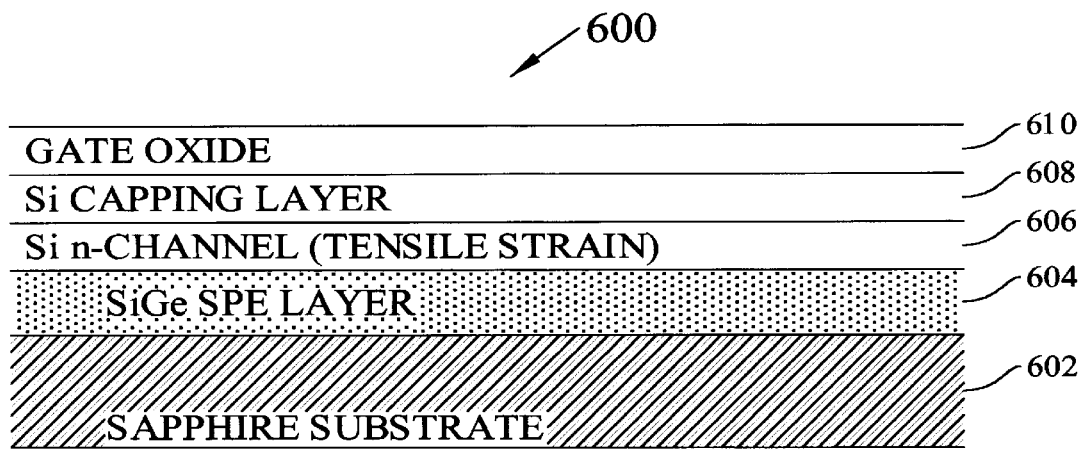
FIG. 6 is a diagram of an electronic device structure using the method of the present invention for making n-channel FET devices.
Figure 7:
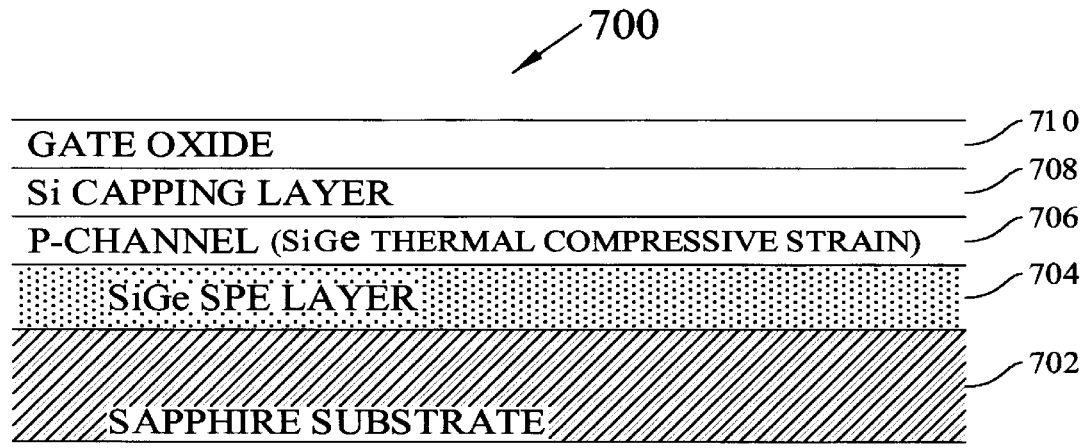
FIG. 7 is a diagram of an electronic device structure using the method of the present invention for making p-channel FET devices.

FIGS. 6 and 7 respectively illustrate exemplary N-channel electronic device structure 600 and p-channel electronic device structure 700. Electronic device structures 600 and 700 may be made for fabricating n-FET and p-FET devices on a single sapphire substrate using the method described above for fabricating silicon germanium alloy. A thin single crystal silicon germanium layer 604 is deposited on sapphire substrate 602. Silicon germanium layer 604 preferably has a thickness sufficient to result in a relaxed crystal interface with sapphire substrate 602 except for strain caused by thermal mismatch. Silicon germanium layer 604 may be ion implanted with silicon or germanium and annealed to form a solid phase epitaxially regrown layer to eliminate twinning defects in a similar manner as with silicon-on-sapphire. Next a thin single crystal silicon layer 606 is deposited on silicon germanium layer 604. Silicon layer 606 is preferably about 10 nm thick and may be used to form n-channel FET devices using well known photolithographic techniques. The lattice constant mismatch at the silicon germanium interface causes single crystal silicon layer 606 to be tensile strained. Also, a silicon capping layer 608 having a typical thickness of about 5 nm and a gate oxide layer 610 having a typical thickness of 7 nm may be added to complete n-channel device structure 600.

In regions where p-channel FET devices are to be made, silicon germanium alloy layer 704 in FIG. 7 is first deposited on sapphire substrate 702 as described above. A single crystal silicon layer 706 is deposited on silicon germanium alloy layer 704. A silicon capping layer 708 may be added or combined with single crystal layer 706. A gate oxide layer 710 is deposited on silicon capping layer 708. Thinned regions of single crystal silicon layer 706 may be used to grow gate oxide, nitrides, or oxinitride to make silicon germanium p-channel devices. A sufficiently thick silicon layer may also be used to allow a gate oxide to be grown in the n-channel devices. In this manner the performance of both n-channel and p-channel MOS devices may be optimized in the same substrate. This optimization of performance may include varying the alloy composition, modulating the doping, ion implantation defined by photolithography, and other means to optimize individual structures through doping, damage, or strain control.

Other modifications, variations, and applications of the present invention may be made in accordance with the above teachings other than as specifically described to practice the invention within the scope of the following claims.

We claim:

1. A method for fabricating a silicon-germanium alloy on a sapphire substrate comprising the steps of:

passivating a surface of the sapphire substrate by exposing the sapphire substrate to one of hydrogen and deuterium while maintaining a passivation temperature and subsequently ramping the passivation temperature down to the deposition temperature;

maintaining a deposition temperature;

exposing the passivated surface to silane and germane to form a layer of single crystal silicon germanium alloy on the passivated surface of the sapphire substrate;

and ramping the deposition temperature down to a selected temperature during the step of exposing the passivated surface to germane to increase germanium content of the single crystal silicon germanium alloy.

2. The method for fabricating a silicon-germanium alloy on a sapphire substrate of claim 1 wherein the deposition temperature is about 900 degrees C.

3. The method for fabricating a silicon-germanium alloy on a sapphire substrate of claim 1 wherein the silane comprises a flow of about 1 slm of about 2 percent silane in a hydrogen carrier.

4. The method for fabricating a silicon-germanium alloy on a sapphire substrate of claim 1 wherein the germane comprises a flow of at least 200 sccm of about 10 percent germane in a hydrogen carrier.

5. The method for fabricating a silicon-germanium alloy on a sapphire substrate of claim 1 wherein the deposition temperature is ramped down to a selected value of about 650 degrees C. at a ramp rate of about 100 degrees per minute.

6. The method for fabricating a silicon-germanium alloy on a sapphire substrate of claim 1 further including the step of modifying the surface of the sapphire substrate before depositing the silicon germanium alloy by using at least one of ion implantation, chemical etch, and exposure to plasma.

7. The method for fabricating a silicon-germanium alloy on a sapphire substrate of claim 1 further comprising the steps of:

depositing a layer of single crystal silicon on the layer of single crystal silicon germanium alloy;

and depositing a gate dielectric layer on the layer of single crystal silicon germanium alloy.

8. The method for fabricating a silicon-germanium alloy on a sapphire substrate of claim 7 further including the steps of ion implanting the layer of single crystal silicon germanium alloy with one of silicon and germanium and annealing to form a solid phase epitaxially regrown layer.

9. The method for fabricating a silicon-germanium alloy on a sapphire substrate of claim 8 further including the steps of depositing at least one of a gate dielectric, nitride, and oxinitride for making silicon germanium p-channel devices.

10. The method for fabricating a silicon-germanium alloy on a sapphire substrate of claim 8 further including the step of optimizing performance of the layer of single crystal silicon germanium alloy for n-channel and p-channel devices by at least one of varying the alloy composition, modulating the doping, defining ion implantation by photolithography, etching, and strain control definition of contact and metallization to the devices.

* * * * *